United States Patent [19]

Nakano et al.

[11] Patent Number: 5,644,121
[45] Date of Patent: Jul. 1, 1997

[54] SOLID STATE IMAGE SENSOR

[75] Inventors: Takashi Nakano; Akiyoshi Kohno; Kozo Orihara, all of Tokyo, Japan

[73] Assignee: NEC Corporation, Tokyo, Japan

[21] Appl. No.: 568,930

[22] Filed: Dec. 7, 1995

[30] Foreign Application Priority Data

Dec. 7, 1994 [JP] Japan .................................. 6-303572

[51] Int. Cl.$^6$ ........................................... H01J 40/14
[52] U.S. Cl. .................................. 250/208.1; 257/249
[58] Field of Search ........................ 250/208.1, 214.1; 257/239, 249, 393, 387, 386, 394; 377/60; 348/311

[56] References Cited

U.S. PATENT DOCUMENTS 5,196,692   3/1993   Arinaga et al. ................. 250/208.1
5,338,948   8/1994   Sims ................................... 257/249

Primary Examiner—Que Le

[57] ABSTRACT

Signal charges are photoelectrically generated by a plurality of photodiodes, transferred through a transfer register to a charge detection capacitance and sensed through a floating junction, as a potential change of the charge detection capacitance to be amplified and output at an output amplifier composed of a plurality of stages of driver transistors, in which a field insulation film of a first stage driver transistor is formed, under a gate electrode, with a trapezoidal region left so that the gate electrode has a width thereof varied to be wider at a source end than at a drain end, permitting an increased reduction of the charge detection capacitance.

2 Claims, 5 Drawing Sheets

SOLID STATE IMAGE SENSOR

BACKGROUND OF THE INVENTION

The present invention relates to a solid state image sensor, and in particular, to a solid state image sensor of the type which transfers charges obtained by a photoelectric conversion of a photodiode to a charge detection capacitance for a storage before outputting via an output amplifier.

DESCRIPTION OF THE RELATED ART

FIG. 1 shows an entirety of a typical conventional solid state image sensor. In FIG. 1, photodiodes are arrayed in a matrix form with m diodes in a vertical direction and n diodes in a horizontal direction. A number of vertical transfer registers (CCD) 52 extend between vertical arrays of m photodiodes. The vertical transfer registers 52 are connected to a horizontal transfer register (CCD) 53 provided with an output amplifier (on-chip amplifier) 54 at a horizontal transfer end thereof.

In the solid state image sensor, rays of incident light from an object are photoelectrically converted by the photodiodes 51, to be stored as signal charges. Among the signal charges, for example, those stored in odd number photodiode rows are read to the vertical transfer registers 52, to be transferred to the horizontal transfer register 53, and amplified at the output amplifier 54, to be output. Next, in a similar manner, those signal charges stored in even number photodiode rows are output from the output amplifier 54.

In a typical solid state image sensor, an output section including an output amplifier 54 is constituted, as in a circuit diagram of FIG. 2. In FIG. 2, the output amplifier 54 is exemplarily composed of N channel MOS field effect transistors (FET) 32 to 37. A source of FET 32 is connected to a gate of FET 33 and to a drain of FET 35, a source of FET 33 is connected to a gate of FET 34 and to a drain of FET 36, a drain of FET 34 is connected to a source of FET 37, and respective gates of FETs 35, 36 and 37 are coupled in common.

That is, in the output amplifier, FETs 32, 33 and 34 constitute a first, a second, and a third state of source follower driver transistors, respectively, which are diode-connected at their respective source ends to FETs 35, 36 and 37 constituting load transistors, respectively.

Analogous to the other driver transistors 33 and 34, the first stage driver transistor 32 is constituted as shown in a plan view of FIG. 3. That is, a gate electrode 62 rectangular in shape includes an effective gate electrode associated with a field oxide film 61 thereunder. At both sides of the effective gate electrode, a drain 63 and a source 64 are formed, respectively, with a rectangular region. Thus, channels of the driver transistors 32 to 34 have a rectangle form.

The gate of the first stage driver transistor 32 of the output amplifier of such the constitution is connected to a floating junction (FJ) and to a source of a reset transistor 38.

Accordingly, signal charges transferred by the horizontal transfer register 53 are once stored in a charge detection capacitance which is a total of a capacitance of the FJ 31, a wiring capacitance between the FJ 31 and the first stage driver transistor 32 of the output amplifier 54, and an input capacitance of the first driver transistor 32, before a discharge to a reset drain 39 through the reset transistor 38, as it is turned on with a reset pulse supplied to its gate.

The signal is sensed through an ohmic contact of the FJ 31, as a potential change of the charge detection capacitance in operation, and undergoes a buffering amplification of the driver transistors 32 to 34, to be output as an image signal from an output terminal 40.

Recently, regarding a solid state image sensor having an output section with such a charge detection capacitance, there is an increased need for a reduced sensor size and an increased multiplicity of pixels, with an increased tendency to a miniaturization of pixels. However, such a miniaturization of pixels causes a reduced sensitivity, leaving levels of noises such as due to a resetting of reset transistor 38 and on-chip amplifier noises such as of output amplifier 54, as they were, resulting in a deteriorated S/N ratio of an output image signal. Therefore, such the miniaturization needs a sufficient allowance for an S/N ratio.

In this respect, for such conventional solid state sensors in which a smaller charge detection capacitance provides an output image signal with a higher S/N ratio, there have been employed measures such as: by injecting a phosphorus (P) ion as an impurity to a subregion of an $N^+$ region for an ohmic contact to FJ 31 to reduce an $N^+$ density therein, expanding a depletion layer to thereby reduce a capacitance of FJ 31; by shortening a wiring distance between FJ 31 and a gate of first stage driver transistor 32 of output amplifier 54 to have a reduced wiring capacitance; and by minimizing a dimension of first stage driver transistor 32 to a critical point of a process to have a reduced input capacitance.

However, such the conventional reduction in charge detection capacitance with an intention to secure a competent S/N ratio for an image signal of a solid state image sensor appears insufficient, as a further miniaturization is desired.

The present invention has been achieved with such points in mind.

SUMMARY OF THE INVENTION

It therefore is an object of the present invention to provide a solid state image sensor, permitting the more reduced charge detection capacitance to be achieved by giving an improved form to a channel of a first stage driver transistor of an output amplifier.

To achieve the object, a genus of the present invention provides a solid state image sensor in which signal charges are photoelectrically generated by a plurality of photodiodes, transferred through a transfer register to a charge detection capacitance and sensed through a floating junction, as a potential change of the charge detection capacitance to be amplified and output at an output amplifier composed of a plurality of stages of driver transistors, wherein a driver transistor of a first stage of the plurality of stages of driver transistors has a channel thereof formed to be narrower at a drain end thereof than at a source end thereof, with an effective width thereof unchanged.

According to a species of the genus of the invention, the driver transistor of the first stage, as it is seen from above a gate electrode thereof, may preferably have right under the gate electrode a channel stop thereof formed to define a trapezoidal region left so that the gate electrode has a gate width thereof varied to be wider at the source end than at the drain end.

In a solid state image sensor, a charge detection capacitance comprises a total of a capacitance of a floating junction, a wiring capacitance between the floating junction and a first stage driver transistor of an output amplifier, and an input capacitance (Cin) of the first stage driver transistor.

Among those component capacitances, the input capacitance Cin of the first stage driver transistor which comprises an N channel source follower transistor can be expressed, letting g be a gain, Cgd be a capacitance between a gate and a drain, and Cgs be a capacitance between the gate and a source, such that:

$$C_{in} = C_{gd} + (1-g) \cdot C_{gs}.$$

As the driver transistor is a source follower transistor, the gain g ideally is "1" in the above expression: practically, it may have a maximum about 0.95. The capacitance Cgd between gate and drain should thus have a larger contribution to the input capacitance Cin, than the capacitance Cgs between gate and source.

According to the present invention, in such the first stage driver transistor of an output amplifier, a channel thereof is formed to be narrower at a drain end thereof than at a source end thereof, with an effective width thereof unchanged, thus permitting the input capacitance Cin to be effectively reduced without changing a mutual conductance gm of the first stage driver transistor.

As an N channel type is typical in the art, the foregoing description is called for a case of N channel. It will however be seen that in a case of P channel also, a channel shape of a first stage driver transistor may be formed to be narrower at a drain end than that at a source end to effectively reduce an input capacitance Cin without changing a mutual conductance gm of the first stage driver transistor.

BRIEF DESCRIPTION OF THE DRAWINGS

The objects, features and advantages of the present invention will become more apparent from consideration of the following detailed description, taken in conjunction with the accompanying drawings, in which.

DESCRIPTION OF THE PREFERRED EMBODIMENTS

Figure 1:
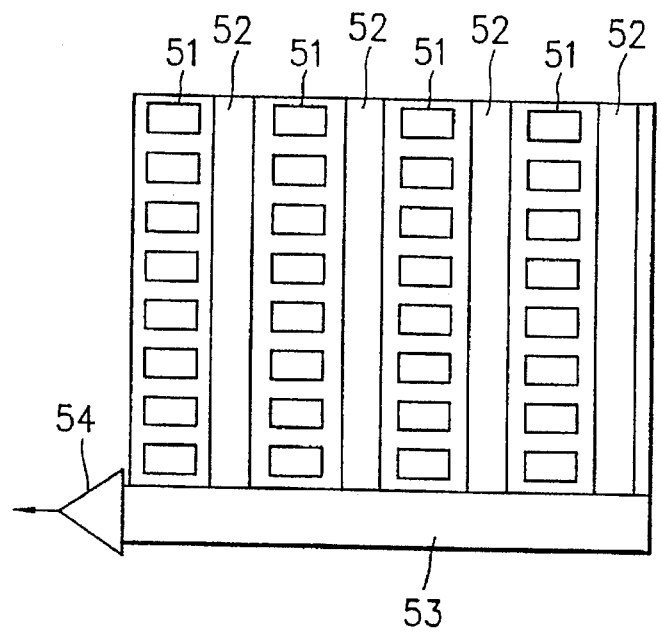
FIG. 1 is an elevation of a typical conventional solid state image sensor.

There will be detailed below a preferred embodiment of the present invention, with reference to the drawings. Like members are designated by like reference characters.

Figure 4:
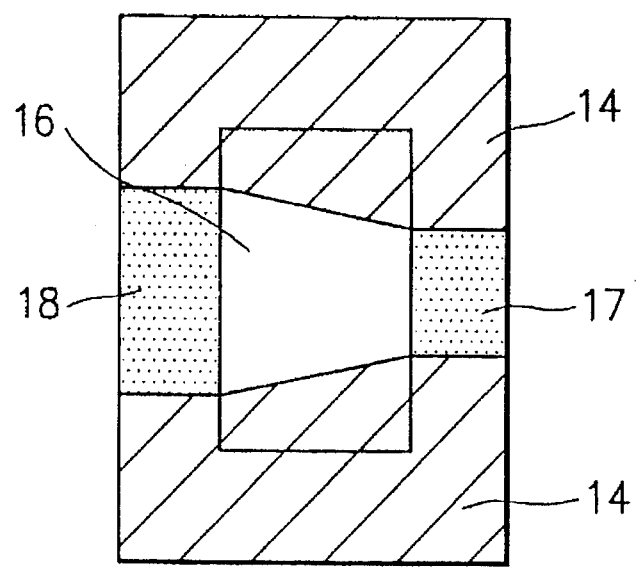
FIG. 4 is a plan view of a first stage driver transistor of an output section of a solid state image sensor according to an embodiment of the present invention.
Figure 5:
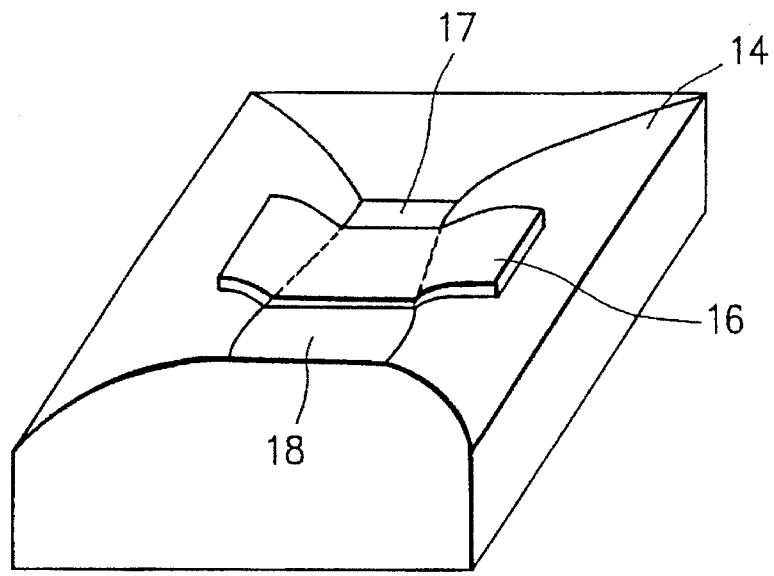
FIG. 5 is a perspective view of the first stage driver transistor of FIG. 4.

FIG. 4 shows a plan view of a first stage driver transistor of an output amplifier as an essential part of a solid state image sensor according to an embodiment of the present invention, having a charge detection capacitance in an output section. FIG. 5 shows a perspective view of the first stage driver transistor, and FIG. 6 shows a circuit diagram of the output section.

Figure 2:
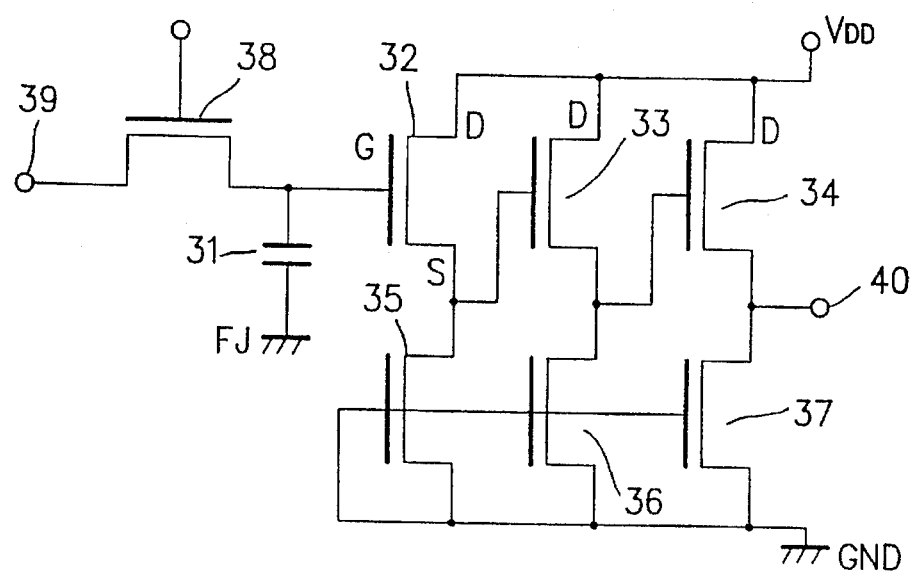
FIG. 2 is a partial circuit diagram of an output section of the conventional solid state image sensor of FIG. 1.
Figure 6:
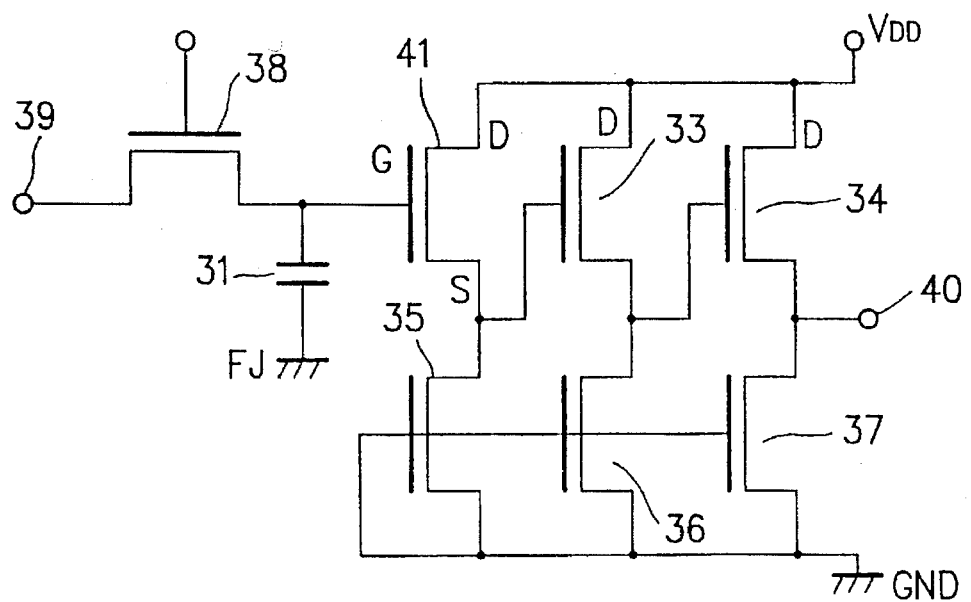
FIG. 6 is a partial circuit diagram of the output section according to the embodiment of the present invention.

The output section circuit shown in FIG. 6 is basically analogous to that of the conventional solid state image sensor shown in FIG. 2. In FIG. 6, N channel FETs 41, 33 and 34 constitute first, second and third stages of source follower driver transistors, respectively, which are diode-connected at their source ends to N channel FETs 35, 36 and 37 constituting load transistors, respectively. The present embodiment is featured, to the conventional example, by a constitution of the first stage driver transistor 41.

As described, signal charges transferred by a horizontal transfer register is once stored in a charge detection capacitance which is a total of a capacitance of a FJ 31, a wiring capacitance between the FJ 31 and the first stage driver transistor 41 of an output amplifier, and an input capacitance of the first driver transistor 41, before a discharge to a reset drain 39 through the reset transistor 38, when the reset transistor 38 is turned on by a reset pulse supplied to its gate.

Further, the signal is taken out through an ohmic contact at the FJ 31, as a potential change of the charge detection capacitance during operation, and undergoes a buffering amplification by the driver transistors 41, 33 and 34, to be output as an image signal to an output terminal 40.

Different from the other driver transistors 33 and 34, the first driver transistor 41 of the embodiment is constructed as shown in the plan view of FIG. 4 and the perspective view of FIG. 5. That is, as shown in FIGS. 4 and 5, although the shape of a gate electrode 16 is a rectangle, a field oxide film 14 underneath it makes the gate width at a source 18 end larger than that at a drain 17 end, regarding the effective gate electrode and the shape of the channel.

That is, when observing the gate electrode 16 of the first stage driver transistor 41 from above, the field insulation film 14 just beneath the gate electrode 16 is formed in a trapezoid such that the gate width at a source 18 end is larger than that of a drain 17 end as shown with hatching lines in FIG. 4, and as shown in FIG. 5, it is tapered.

A fabrication method of the driver transistor 41 will be described with reference to FIGS. 7A to 7D.

Figures 1, 7A:
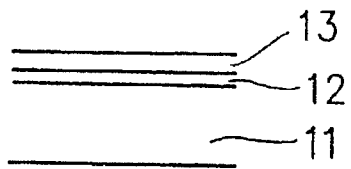
FIGS. 7A, 7B, 7C and 7D are illustrations describing a fabrication method of the first stage driver transistor of FIG. 4.
Figures 2, 7A:
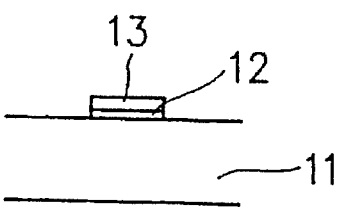
Figures 3, 7A:
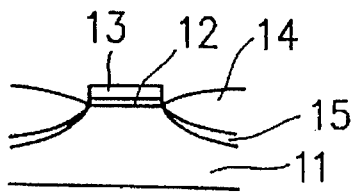
Figures 4, 7A:
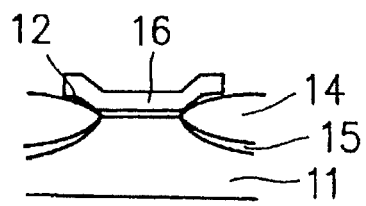
Figures 5, 7A:
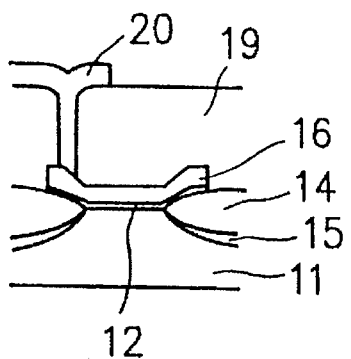
Figure 7C:
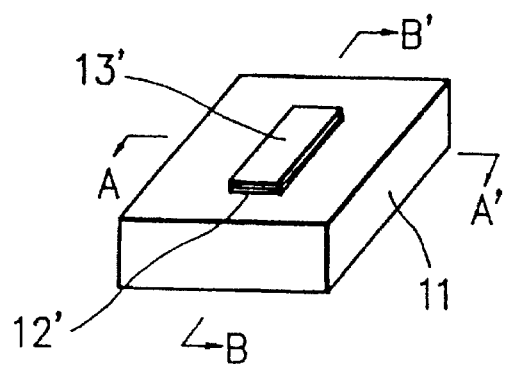
Figures 4, 5, 7B, 7D:
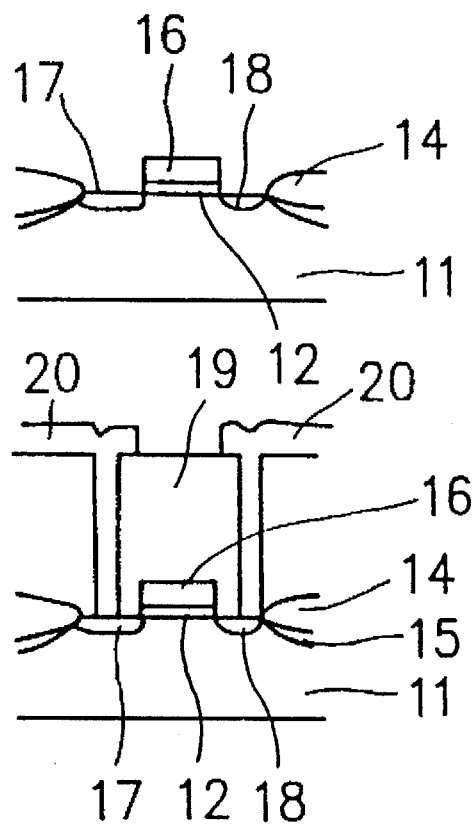

FIGS. 7A and 7B show sectional views in part of a work in steps of a fabrication process of the first stage transistor of the output amplifier according to an embodiment of the invention.

First, as shown at ① of FIG. 7A, a thin silicon dioxide (SiO₂) film 12 is grown on a P type substrate 11, and further thereabove, a silicon nitride ($Si_3N_4$) film 13 is formed. The P type substrate 11 may be a P well formed on an N type substrate.

Next, as shown at ② of FIG. 7A, the $SiO_2$ film 12 and the $Si_3N_4$ film 18 are removed except for the transistor region. By this, as shown in a perspective view of FIG. 7C, there is rectangulary formed a $SiO_2$ film 12' and a $Si_3N_4$ film 13' on the substrate 11. In the figures, A—A' denotes a gate width direction, and B—B' a gate length direction.

On the other hand, in the present embodiment, as shown in a perspective view of FIG. 7D, by etching the $SiO_2$ film 12 and the $Si_3N_4$ film 18 by use of a mask, they are formed to be a trapezoid (tapered shape) such that a (gate width) dimension in the A—A' direction at one end is longer than that in the A—A' direction at the other end.

Next, as shown at ③ of FIG. 7A, a P type inpurity is ion-injected to form a field inversion region 15. Then, a wafer is thermally oxidized and this causes a growth of a field oxide film 14 by the $SiO_2$ as a field insulation film only, where the $Si_3N_4$ film 13 does not exist. FIGS. 7A and 7B show sectional views along A—A' and B—B' of FIG. 7D, repectively.

Further, as shown at ④ of FIGS. 7A and 7B, the $SiO_2$ film at the transistor region is removed and the thin gate oxide film 12 is grown again. Then, a patterning is applied to form a gate electrode 16, e.g., a polycrystal silicon electrode. Next, after injecting an N type inpurity of high density, e.g., by ion-injection, the gate electrode 16 is diffused as a mask to form $N^+$ diffusion layers 17 and 18, as shown at ④ of FIG. 7B. Here, an $N^+$ diffusion layer 17 is a drain and an $N^+$ diffusion layer 18 is a source.

Further, as shown at ⑤ of FIGS. 7A and 7B, a thick oxide film is grown as an interlayer insulation film 19, e.g., by a vapor phase epitaxal method, and after opening contact holes for the source and the drain, a material such as an alminium is deposited to form an electrode 20.

The fabrication method of the present embodiment is basically similar to that of a conventional field effect transistor. However, when forming the transistor region as shown at ② of FIG. 7A, the $SiO_2$ film 12 and the $Si_3N_4$ film 13 are formed as a trapezoid (tapered shape) as shown in the perspective view of FIG. 7D, whereby the shape of the gate electrode 16 shown at ④ of FIGS. 7A and 7B and the shape of the transistor after formation of the drain 17 and the source 18 become as shown in FIGS. 4 and 5. Accordingly, a trapezoid channel shape in which the drain 17 end is narrower than the source 18 end is obtained without changing an effective width of channel.

Figure 3:
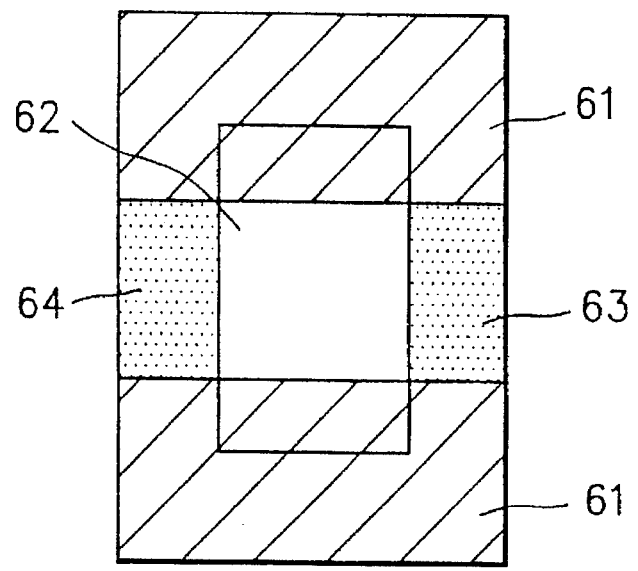
FIG. 3 is a plan view of a first stage driver transistor of the output section of FIG. 2.

In Table 1, an input capacitance of the first stage driver transistor in the solid state image sensor of the present embodiment, in which an output section of a circuit constitution shown in FIG. 6 has the N channel FET fabricated as the first stage driver transistor 41 of the output amplifier, is compared with that of the conventional solid state image sensor in which an output section of a circuit constitution shown in FIG. 8 has a rectangular transistor whose gate effective width is the same as the driver transistor 41 and the channel shape is typical, as shown in FIG. 3.

TABLE 1

| CHAN. WIDTH (μm) | 20→10 | 20→5 | 10→6 | 10→4 |
| --- | --- | --- | --- | --- |
| CHAN. EFF. WIDTH | 12.4 | 8.0 | 7.8 | 6.0 |
| Cin (fF) | 3.57 | 2.08 | 2.08 | 1.49 |
| Cin' (fF) | 4.07 | 2.62 | 2.55 | 1.97 |
| Cin/Cin' | 0.88 | 0.79 | 0.82 | 0.76 |

In Table 1, values at the left side and the right side of arrows in the channel width column represent channel widths at the source 18 end and the drain 17 end, repectively. Further, Cin and Cin' represent input capacitances of the first stage driver transistors 41 and 32, repectively. An effective value is obtained by a comparison between a measured value of a tapered-channel transistor of the embodiment biased to an output amplifier operation point and that of a transistor with a typical channel. Further, Cgd, Cgs are obtained by a simulation. A gain g is supposed to be "0.95".

As shown in Table 1, the input capacitance Cin of the embodiment of the tapered channel is 10 to 20% less than that of a typical rectangular channel of the same effective value.

Therefore, according to the present embodiment, a charge detection capacitance is effectively reduced, thereby improving an S/N ratio as well as a detection sensitivity.

The present invention is not to be restricted by this embodiment. For example, a channel stop which regulates the channel shape of the first stage driver transistor is indicated as the field oxide film 14 in the embodiment, but may be limited to a high density P type layer, or may be formed by opening a hole on the substrate.

As described, according to the present invention, by making the channel shape of the first stage driver transistor of the output amplifier at the drain end narrower than that at the source end while keeping an effective width of a channel unchanged, the input capacitance Cin is reduced without changing a mutual conductance gm of the first stage driver transistor. As a result, a charge detection capacitance is effectively reduced when compared to a conventional device. Therefore, according to the present invention, even when pixels are miniaturized, there is no deterioration of a sensitvity, and moreover, a sufficient S/N ratio is secured.

While the present invention has been described with reference to the particular illustrative embodiment, it is not to be restricted by this embodiment but only by the appended claims. It is to be appreciated that those skilled in the art can change or modify the embodiment without departing from the scope and spirit of the present invention.

What is claimed is:

1. A solid state image sensor in which signal charges are photoelectrically generated by a plurality of photodiodes, transferred through a transfer register to a charge detection capacitance and sensed through a floating junction, as a potential change of the charge detection capacitance to be amplified and output at an output amplifier composed of a plurality of stages of driver transistors, wherein:

a driver transistor of a first stage of the plurality of stages of driver transistors has a channel thereof formed to be narrower at a drain end thereof than at a source end thereof, with an effective width thereof unchanged.

2. A solid state image sensor according to claim 1, wherein the driver transistor of the first stage, as it is seen from above a gate electrode thereof, has right under the gate electrode a channel stop thereof formed to define a trapezoidal region left so that the gate electrode has a gate width thereof varied to be wider at the source end than at the drain end.

* * * * *